United States Patent
Ito et al.

(10) Patent No.: US 12,149,387 B2
(45) Date of Patent: Nov. 19, 2024

(54) DIFFERENTIAL COMMUNICATION DRIVER CIRCUIT

(71) Applicant: DENSO CORPORATION, Kariya (JP)

(72) Inventors: Takasuke Ito, Kariya (JP); Yoshikazu Furuta, Kariya (JP); Shigeki Otsuka, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 222 days.

(21) Appl. No.: 17/705,631

(22) Filed: Mar. 28, 2022

(65) Prior Publication Data
US 2022/0321387 A1 Oct. 6, 2022

(30) Foreign Application Priority Data

Mar. 31, 2021 (JP) ................. 2021-060562

(51) Int. Cl.
*H04L 25/02* (2006.01)
*H03K 19/0185* (2006.01)
*H03K 19/20* (2006.01)
*H04B 1/04* (2006.01)

(52) U.S. Cl.
CPC . *H04L 25/0272* (2013.01); *H03K 19/018557* (2013.01); *H03K 19/20* (2013.01); *H04B 1/04* (2013.01)

(58) Field of Classification Search
None
See application file for complete search history.

(56) References Cited

U.S. PATENT DOCUMENTS

| 7,358,780 | B2* | 4/2008 | Chou | H03F 3/45632 |
| | | | | 326/82 |
| 8,908,779 | B2 | 12/2014 | Douglass | |
| 2010/0321069 | A1* | 12/2010 | Komatsu | H04L 25/0272 |
| | | | | 327/108 |
| 2013/0120020 | A1* | 5/2013 | Li | H03K 19/01855 |
| | | | | 326/30 |
| 2014/0062568 | A1 | 3/2014 | Nishizawa | |
| 2015/0188537 | A1* | 7/2015 | Isoda | H03K 19/0185 |
| | | | | 327/108 |
| 2015/0207342 | A1 | 7/2015 | Miyajima | |
| 2020/0044795 | A1* | 2/2020 | Yamaguchi | H04L 7/007 |
| 2021/0367571 | A1* | 11/2021 | Chang | H03F 3/45076 |

FOREIGN PATENT DOCUMENTS

| JP | 200938546 A | 2/2009 |
| JP | 201326640 A | 2/2013 |

* cited by examiner

*Primary Examiner* — Anh Q Tran
(74) *Attorney, Agent, or Firm* — Posz Law Group, PLC

(57) ABSTRACT

A differential communication driver circuit includes a drive unit that drives differential signal lines connected via capacitors by a source current and a sink current. When a noise detection unit detects that in-phase noise is applied to the differential signal lines, a drive assisting unit maintains an amplitude of a differential signal output to the differential signal lines by increasing a current drive capability of the sink current.

5 Claims, 18 Drawing Sheets

DIFFERENTIAL COMMUNICATION DRIVER CIRCUIT

CROSS REFERENCE TO RELATED APPLICATION

The present application is based on and claims the benefit of priority of Japanese Patent Application No. 2021-060562, filed on Mar. 31, 2021, the disclosure of which is incorporated herein by reference.

TECHNICAL FIELD

The present invention relates to a driver circuit that outputs a differential signal by driving an isolated/insulated differential signal line with an electric current.

BACKGROUND ART

When adopting a configuration in which a differential signal is output to a differential signal line, for example, as disclosed in a first comparative example, by connecting a transmission driver circuit to a differential signal line via a pulse transformer, insulation (isolation) is provided, as well as, or at the same time, an in-phase noise is prevented from affecting the differential signal line. However, using a pulse transformer increases the cost. Further, in another comparative example, it is conceivable to achieve insulation at low cost by capacitor coupling. However, the capacitor coupling has low noise-immunity, and when in-phase noise is applied, the balance of the drive current may be lost and the waveform of the communication signal may be distorted.

SUMMARY

It is an object of the present invention to provide a differential communication driver circuit, which eliminates, in a configuration in which a differential signal line is isolated/insulated by capacitor coupling, an influence of in-phase noise without affecting a signal waveform.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
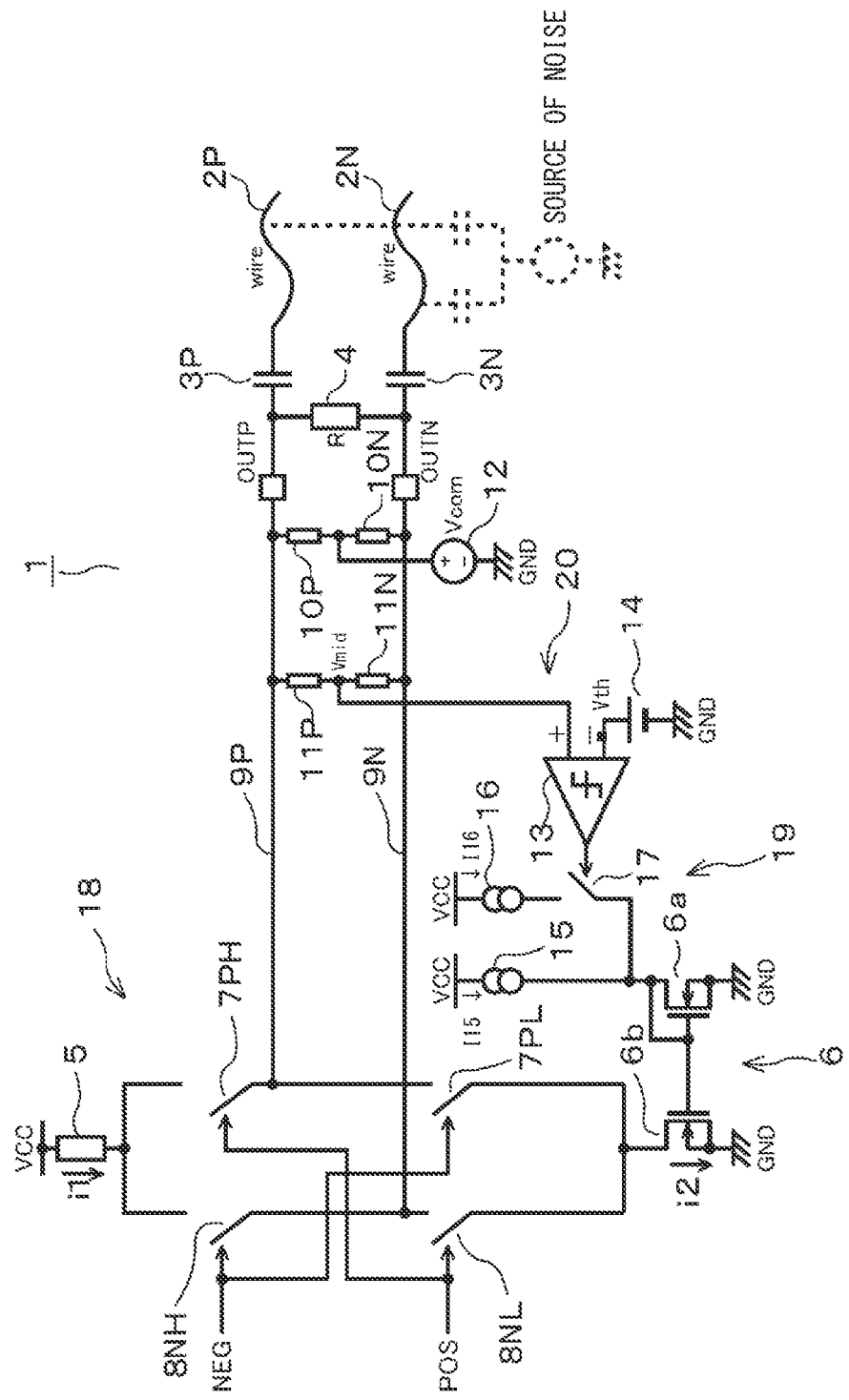
FIG. 1 is a circuit diagram showing a configuration of a differential communication driver circuit according to a first embodiment.
Figure 2:
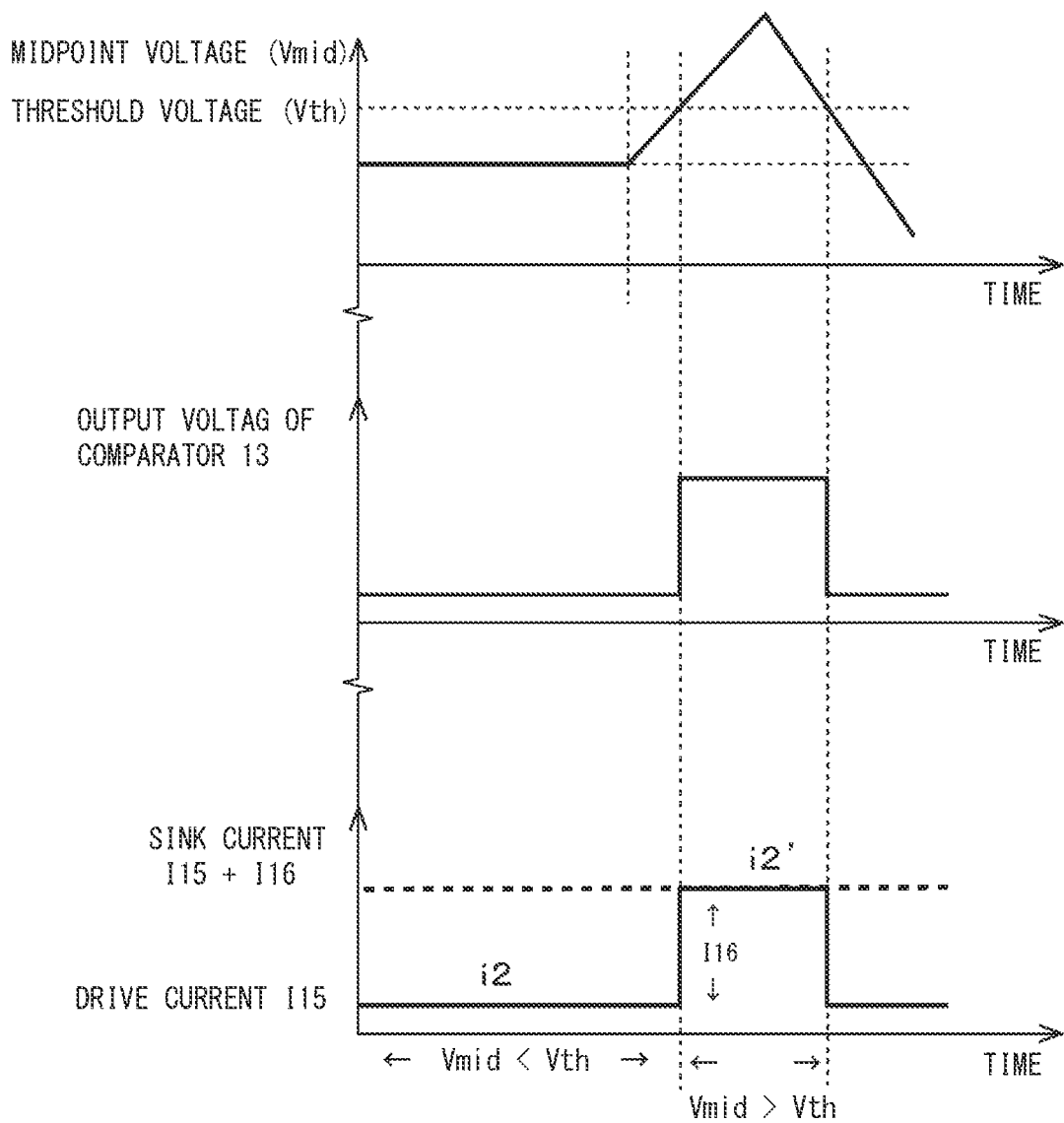
FIG. 2 is a timing chart showing the operation of a noise detection unit and a drive assisting unit.

First Embodiment, FIG. 1 and FIG. 2

As shown in FIG. 1, output terminals OUTP and OUTN of a differential communication driver circuit 1 of the present embodiment are connected to differential signal lines 2P and 2N via coupling capacitors 3P and 3N. A resistor element 4 is connected to a position between the output terminals OUTP and OUTN. One end of a resistor element 5 is connected to a power source VCC, and a source of an N-channel MOSFET 6b is connected to the ground. A series circuit of switches 7PH and 7PL and a series circuit of switches 8NH and 8NL are connected in parallel to a position between an other end of the resistor element 5 and a drain of the MOSFET 6b. Both of the switches 7 and 8 are normally open type.

A common connection points of the switches 7PH and 7PL and a common connection points of the switches 8NH and 8NL are connected to the output terminals OUTP and OUTN via output signal lines 9P and 9N, respectively. A series circuit of resistor elements 10P and 10N and a series circuit of resistor elements 11P and 11N are each connected to a position between the output signal lines 9P and 9N. A midpoint potential Vcom is applied by a voltage source 12 to a common connection point of the resistor elements 10P and 10N. A common connection point of the resistor elements 11P and 11N is connected to a non-inverting input terminal (+terminal) of a comparator 13. A threshold voltage Vth is applied to an inverting input terminal (−terminal) of the comparator 13 by a threshold voltage source 14.

The MOSFET 6b forms a current mirror circuit 6 together with an N-channel MOSFET 6a, and gates of the both are connected to a drain of the MOSFET 6a. The drain of the MOSFET 6a is connected to the power source VCC via an electric current source 15. Further, a series circuit of an electric current source 16 and a normally open type switch 17 is connected to a position between the power source VCC and the drain of the MOSFET 6a. Thus, the switch 17 is closed when an output signal of the comparator 13 is put in a high level (when the non-inverting terminal voltage is greater than the inverting input voltage of the comparator 13).

The switches 7PH and 8NL are closed when a signal POS input from a control circuit (not shown) becomes high level. Then, a source current i1 is supplied from the power source VCC to the output signal line 9P, and a sink current i2 (which equals i1) flows out from the output signal line 9N to the ground. In such manner, the signal line 9P has a high potential and the signal line 9N has a low potential. Further, the switches 8NH and 7PL are closed when an input signal NEG reaches a high level. Then, the source current i1 is supplied to the output signal line 9N, and the sink current i2 (which equals i1) flows out from the output signal line 9P to the ground. In such manner, the signal line 9N has a high potential and the signal line 9P has a low potential.

In the above, the resistor element 5, the current mirror circuit 6, the switches 7 and 8, and the electric current source 15 provide the drive unit 18. The series circuit of the electric current source 16 and the normally open type switch 17 provide a drive assisting unit 19. The resistor element 11 and the comparator 13 provide a noise detection unit 20.

The following will describe an operation of the present embodiment. As shown in FIG. 2, when in-phase noise is applied to the differential signal lines 2P and 2N and the potential rises to exceed the threshold voltage, the output signal of the comparator 13 becomes a high level. Then, the switch 17 is closed and an assisting electric current I16 from the assisting electric current source 16 is supplied to the current mirror circuit 6. In such manner, the sink current increases from i2 to i2'. Along with the above, the source current also increases to i1' (=i2'). In other words, in a low noise case, the comparator output is low, the switch 17 remains normally open, and the current mirror 6 mirrors only the current I15 from the electric current source 15. Further, in a high noise case, the comparator output is high, the switch 17 is closed (ON), and the current mirror 6 mirrors the sum of: (i) the current I15 from the electric current source 15, AND (ii) the assisting current I16 from the assisting electric current source 16.

As described above, according to the present embodiment, the drive unit 18 drives the differential signal lines 2P and 2N connected/coupled via the capacitors 3P and 3N by the source current and the sink current. When the noise detection unit 20 detects that in-phase noise has been applied to the differential signal lines 2P, 2N, the drive assisting unit 19 increases electric current drive capability of the sink current (due to adding the assisting current I16, as discussed above), and maintains the amplitude of the differential signal output to the differential signal lines 2P, 2N. In such a configuration, it is possible, without connecting a noise removal filter circuit to a communication line, to reduce the influence of in-phase noise, and to reduce distortion that occurs in the waveform of the communication signal.

More specifically, the drive unit 18 is provided with the current mirror circuit 6, and the drive assisting unit 19 is composed of a series circuit of the assisting electric current source 16 and the normally open type switch 17 connected to the main current path of the current mirror circuit 6. Then, the comparator 13 of the noise detection unit 20 outputs a signal for closing the switch 17 when the midpoint voltage Vmid of the differential signal lines 2P and 2N exceeds the threshold voltage Vth. In such a configuration, when the comparator 13 detects application of in-phase noise, and the main current of the current mirror circuit 6 can be increased (by adding the assisting electric current I16 to the electric current I15) to reduce distortion of waveform of the communication signal.

Figure 3:
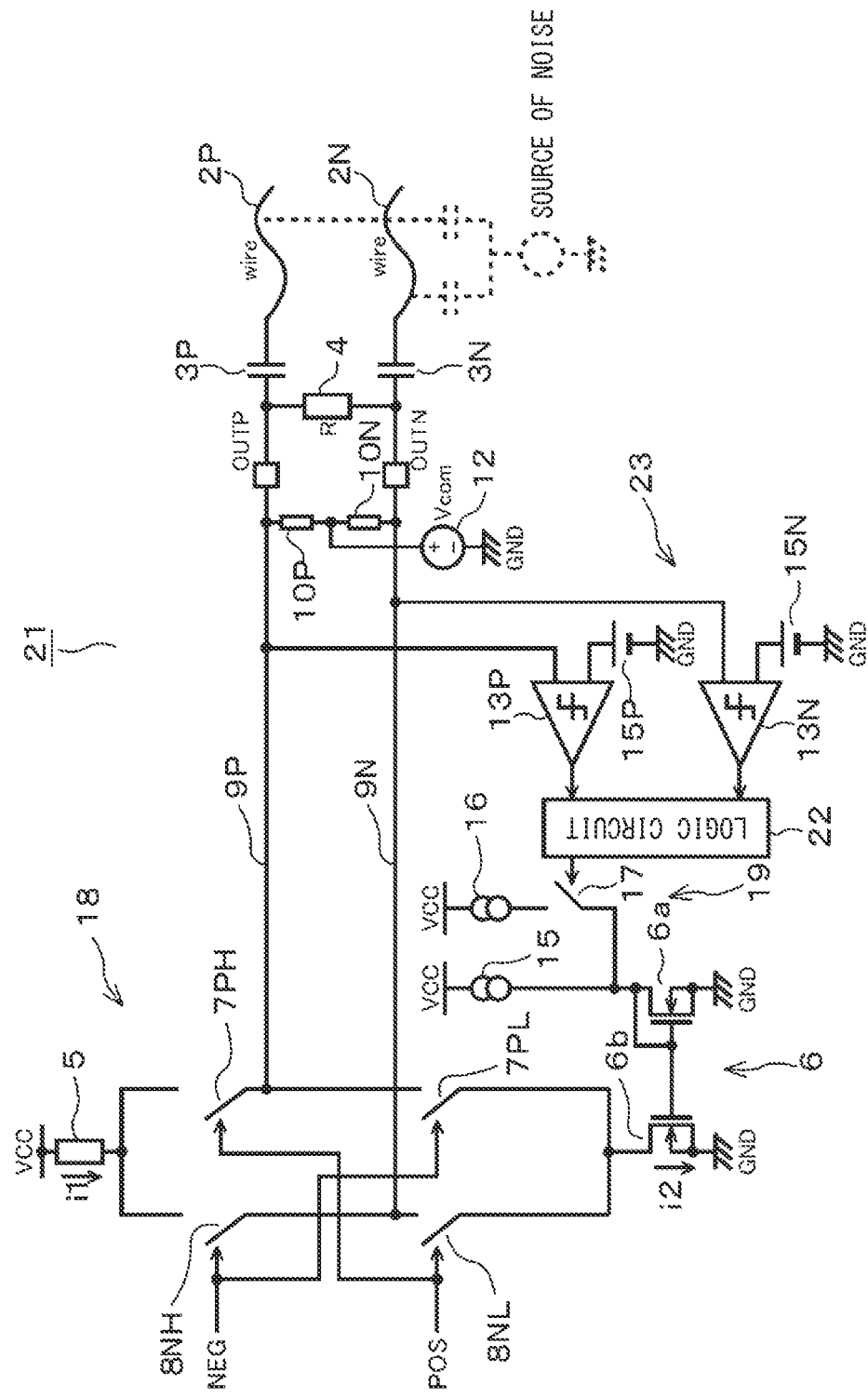
FIG. 3 is a circuit diagram showing a configuration of the differential communication driver circuit according to a second embodiment.

Second Embodiment, FIG. 3

Hereinafter, the identical parts as those in the first embodiment will be designated by the same reference numerals for simplification of the description. Only differences from the first embodiment will be described below. A differential communication driver circuit 21 of the second embodiment shown in FIG. 3 includes a pair of comparators 13P and 13N whose non-inverting input terminals are connected to the differential signal lines 2P and 2N, respectively. The output terminals of the comparators 13P and 13N are connected to the input terminals of the logic circuit 22, respectively. The logic of the logic circuit 22 is AND or OR (logical OR), and the switch 17 is closed by the output signal of the logic circuit 22. The above provides a noise detection unit 23.

According to the driver circuit 21 configured as described above, the voltages of the differential signal lines 2P and 2N are individually detected by the comparators 13P and 13N, and the switch 17 is closed according to the logical product (AND) or the logical sum (OR) of the detection results. Accordingly, the same effect as that of the first embodiment is obtainable.

Figure 4:
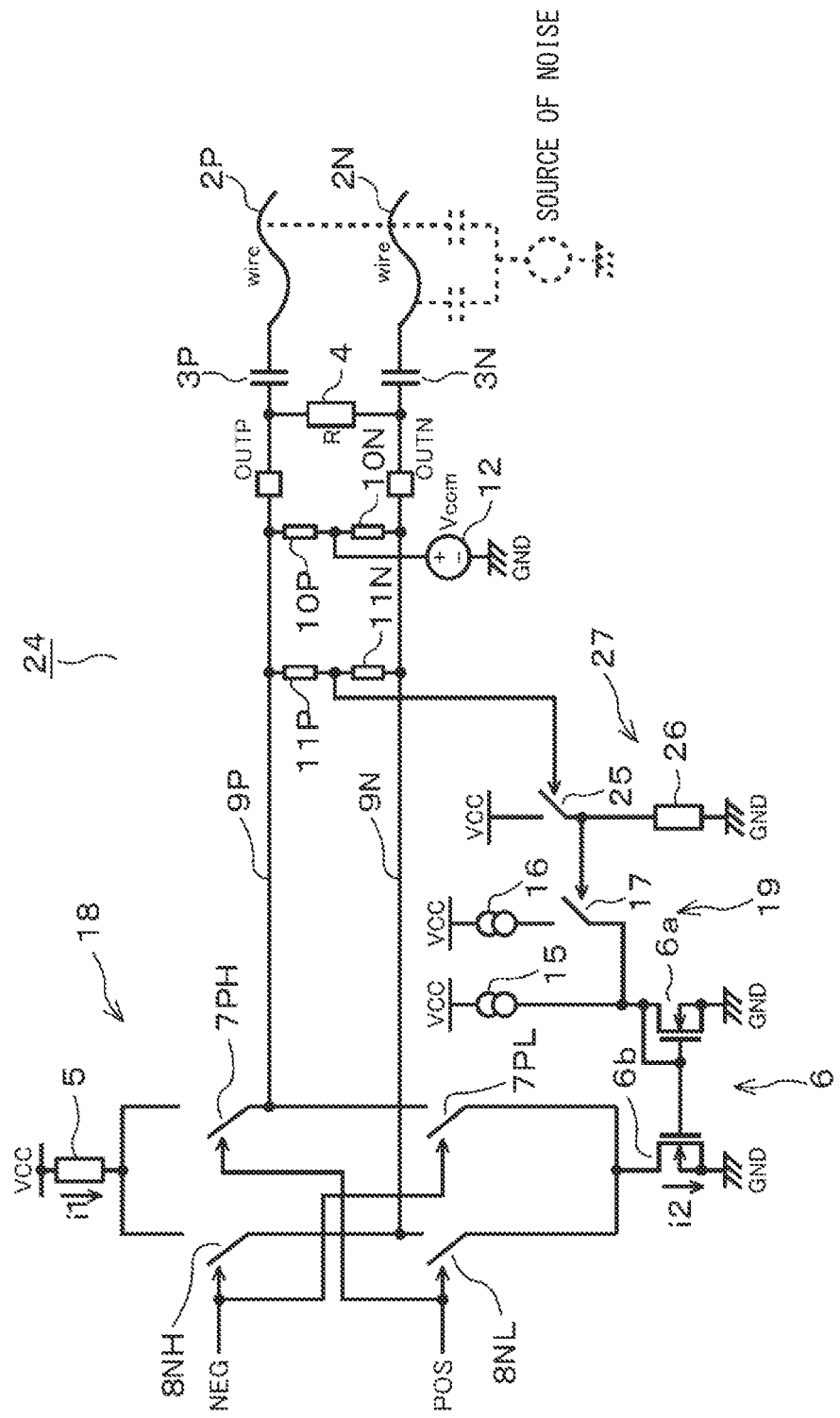
FIG. 4 is a circuit diagram showing a configuration of the differential communication driver circuit according to a third embodiment.

Third Embodiment, FIG. 4

A differential communication driver circuit 24 of the third embodiment shown in FIG. 4 has a configuration in which the comparator 13 of the first embodiment is replaced with a series circuit of a normally open type switch 25 and a resistor element 26. The above provides a noise detection unit 27. The switch 25 is closed when the midpoint voltage of the differential signal lines 2P and 2N rises above a predetermined level. Even in the configuration of the third embodiment configured as described above, the same effect as that of the first embodiment is obtainable.

Figure 5:
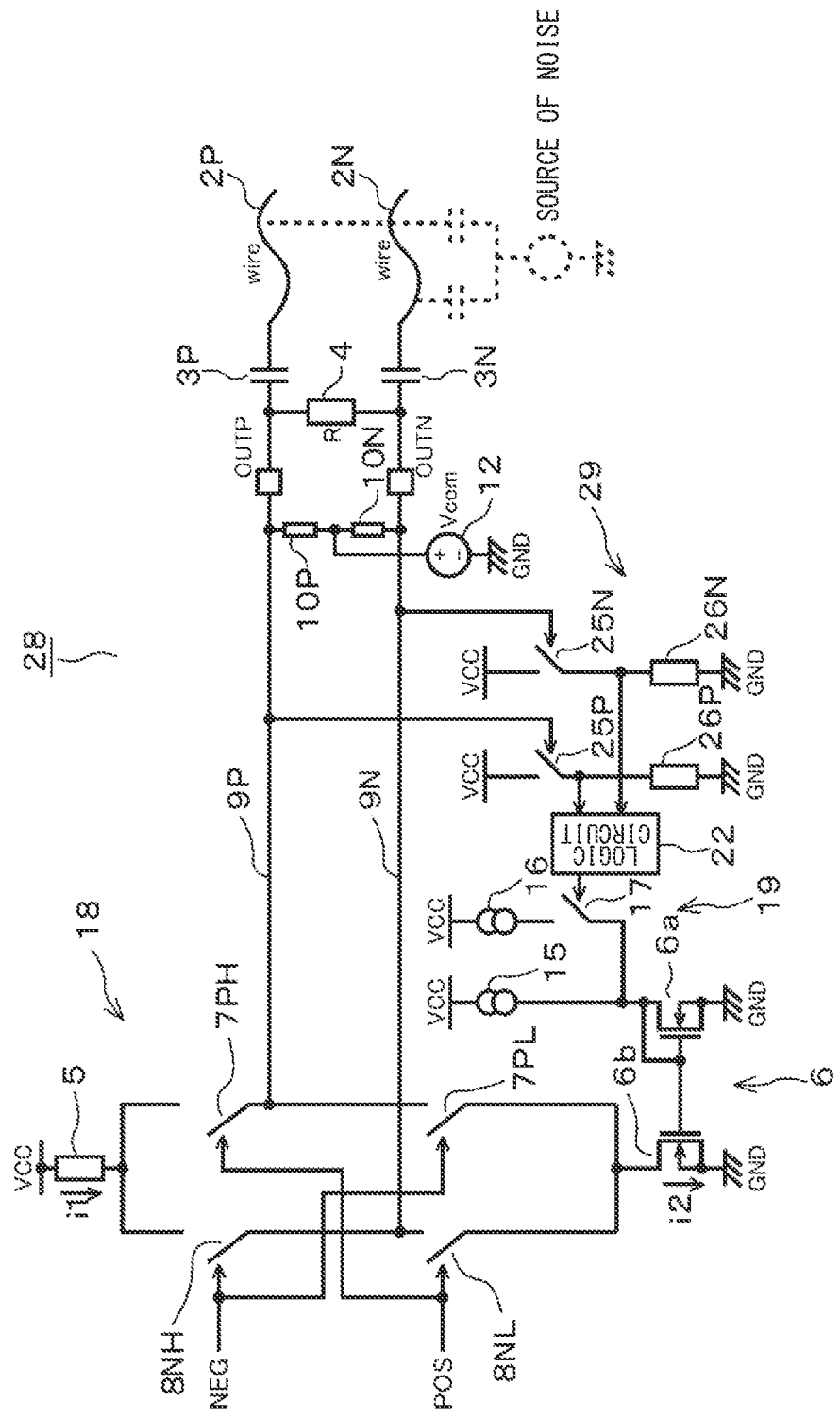
FIG. 5 is a circuit diagram showing a configuration of the differential communication driver circuit according to a fourth embodiment.

Fourth Embodiment, FIG. 5

A differential communication driver circuit 28 of the fourth embodiment shown in FIG. 5 has a configuration in which the comparators 13P and 13N of the second embodiment are respectively replaced with a series circuit of a switch 25P and a resistor element 26P, and a series circuit of a switch 25N and a resistor element 26N. The above provides a noise detection unit 29. Even in the configuration of the fourth embodiment provided in such manner, the same effect as that of the second embodiment is obtainable.

Figure 6:
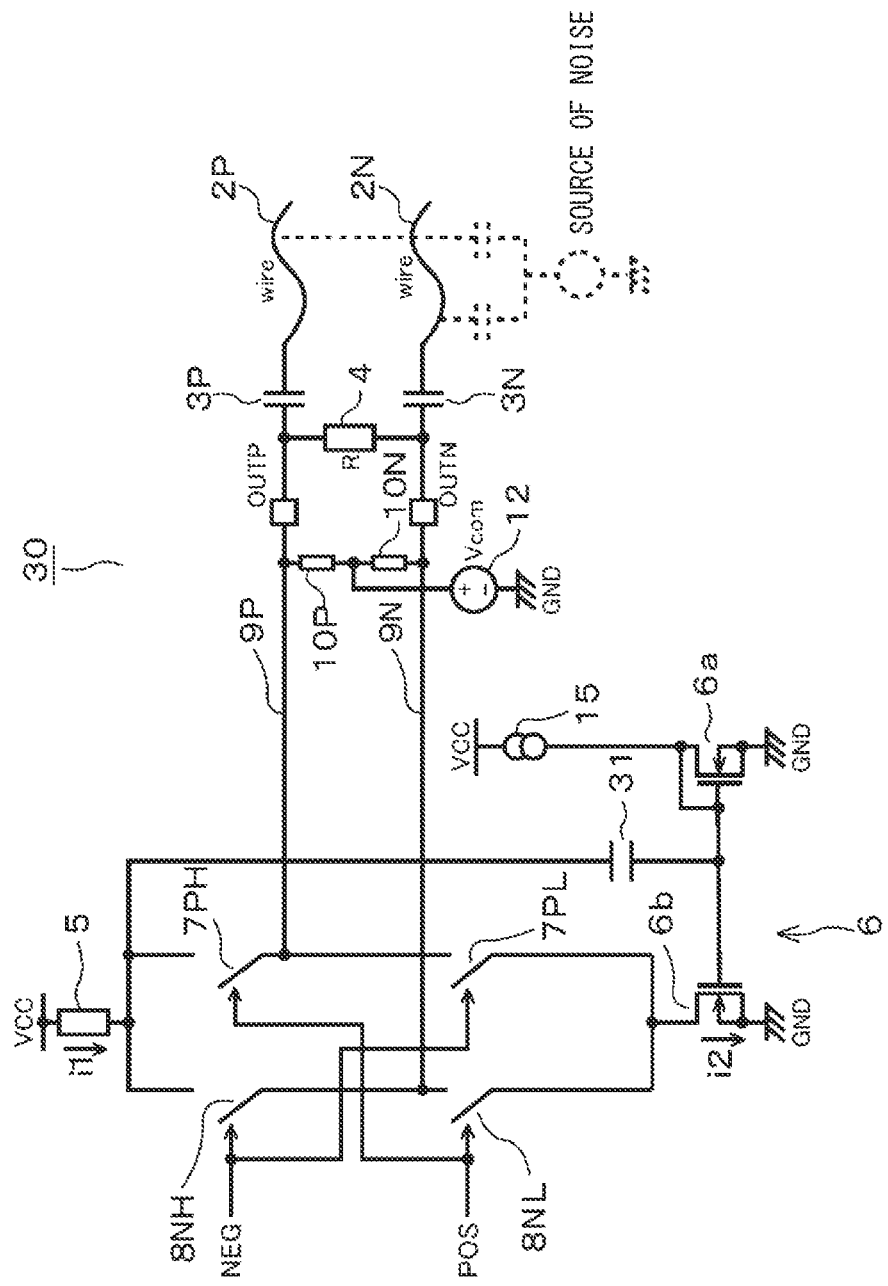
FIG. 6 is a circuit diagram showing a configuration of the differential communication driver circuit according to a fifth embodiment.
Figure 7:
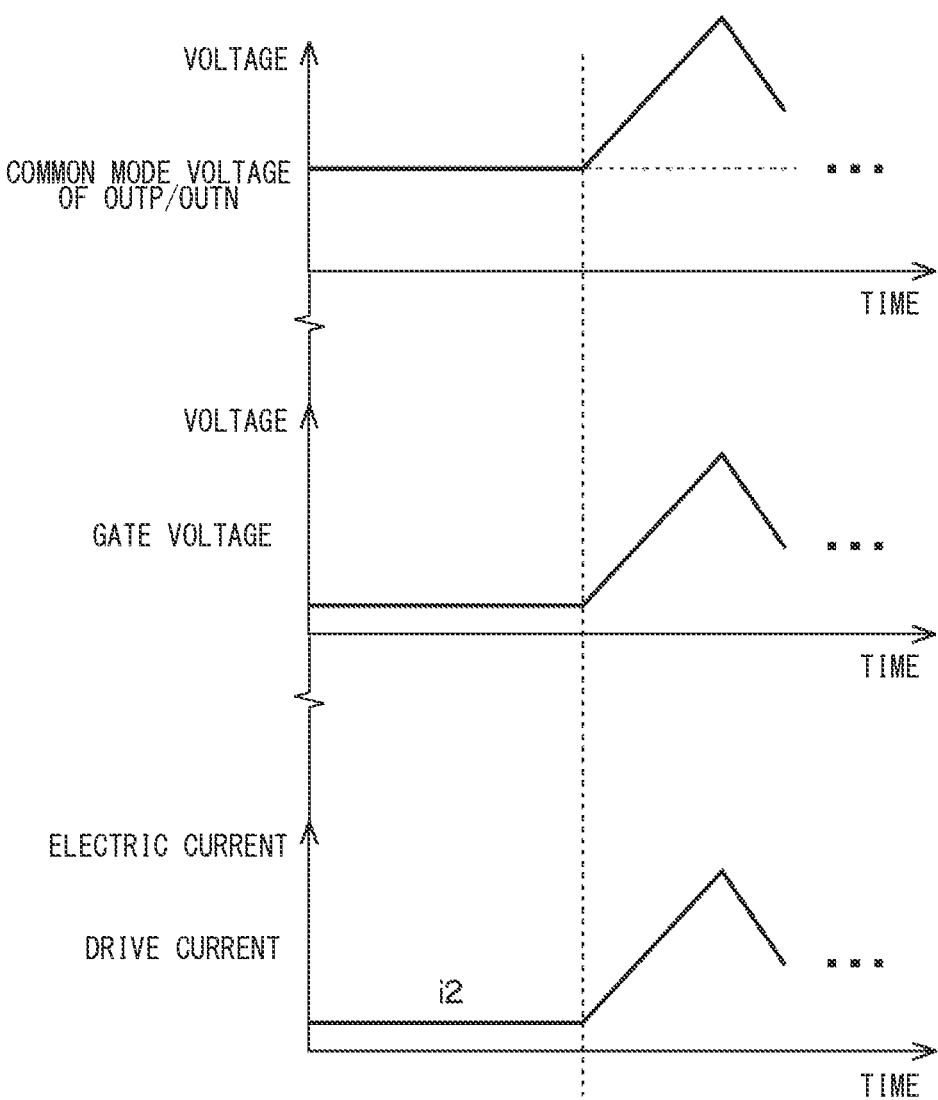
FIG. 7 is a timing chart showing the operation of the noise detection unit and the drive assisting unit.

Fifth Embodiment, FIG. 6 and FIG. 7

In a differential communication driver circuit 30 of the fifth embodiment shown in FIG. 6, the drive assisting unit 19 and the noise detection unit 20 are deleted from the driver circuit 1 of the first embodiment, and a capacitor 31 is connected to a position between the resistor element 5 and a gate common terminal of the current mirror circuit 6. As shown in FIG. 7, when the potential of the differential signal lines 2P and 2N rises due to in-phase noise, the gate potential of the current mirror circuit 6 is raised by the coupling of the capacitor 31 to increase the sink current in an analog manner. In such case, the capacitor 31 corresponds to a noise detection unit.

Figure 8:
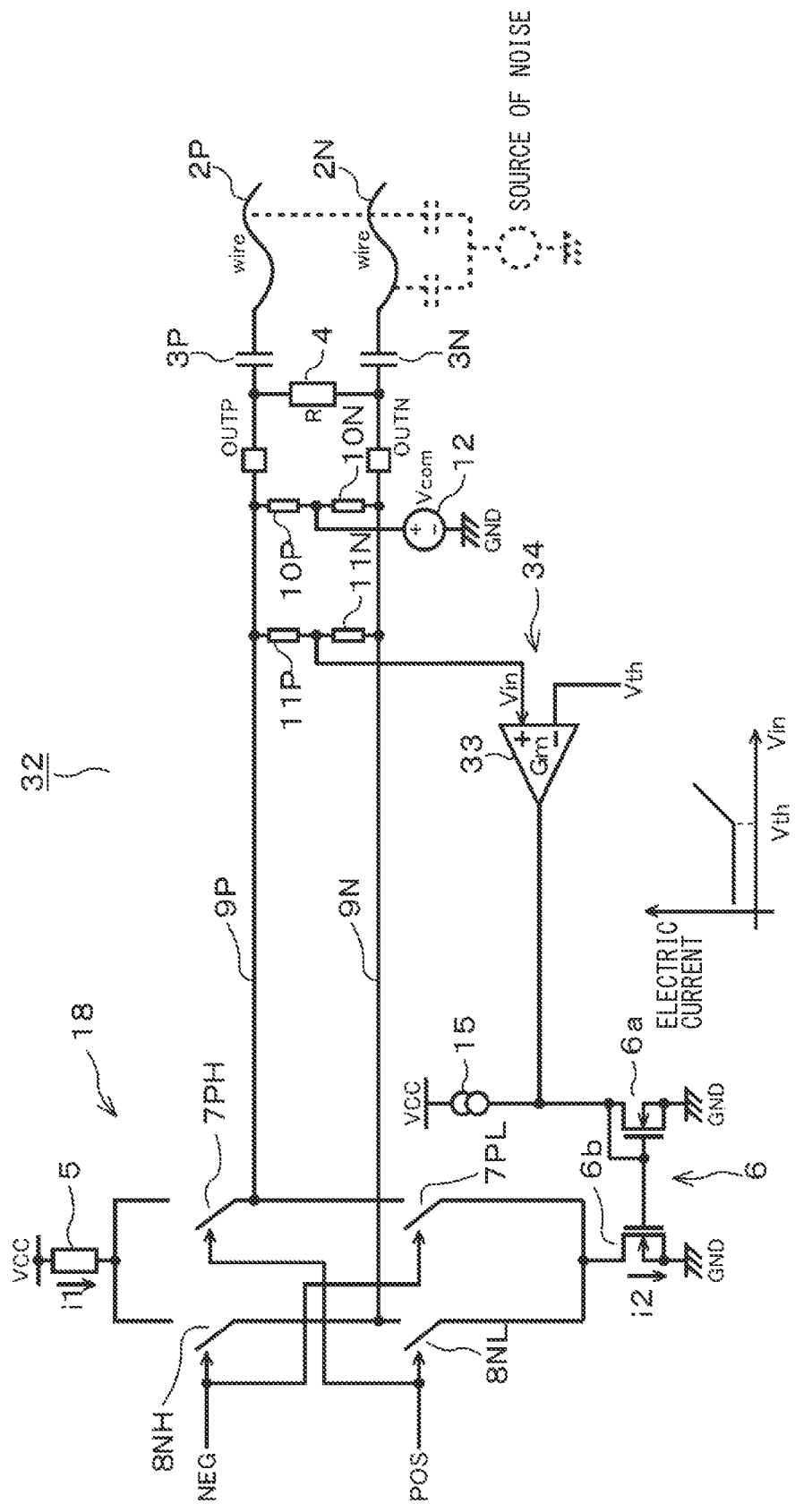
FIG. 8 is a circuit diagram showing a configuration of the differential communication driver circuit according to a sixth embodiment.

Sixth Embodiment, FIG. 8

A differential communication driver circuit 32 of the sixth embodiment shown in FIG. 8 is obtained by removing the drive assisting unit 19 from the driver circuit 1 of the first embodiment and replacing the comparator 13 with an operational amplifier 33. A threshold voltage Vth is given to the inverting input terminal of the operational amplifier 33, and the output terminal of the operational amplifier 33 is connected to the gate common terminal of the current mirror circuit 6. In such manner, a noise detection unit 34 is provided.

Assuming that the voltage input to the non-inverting input terminal of the operational amplifier 33 is Vin, the operational amplifier 33 outputs a voltage corresponding to a difference between the voltage Vin and the threshold voltage Vth to the gate common terminal. In such manner, the gate potential of the current mirror circuit 6 is increased and the sink current is increased in an analog manner just like the case shown in FIG. 7.

Figure 9:
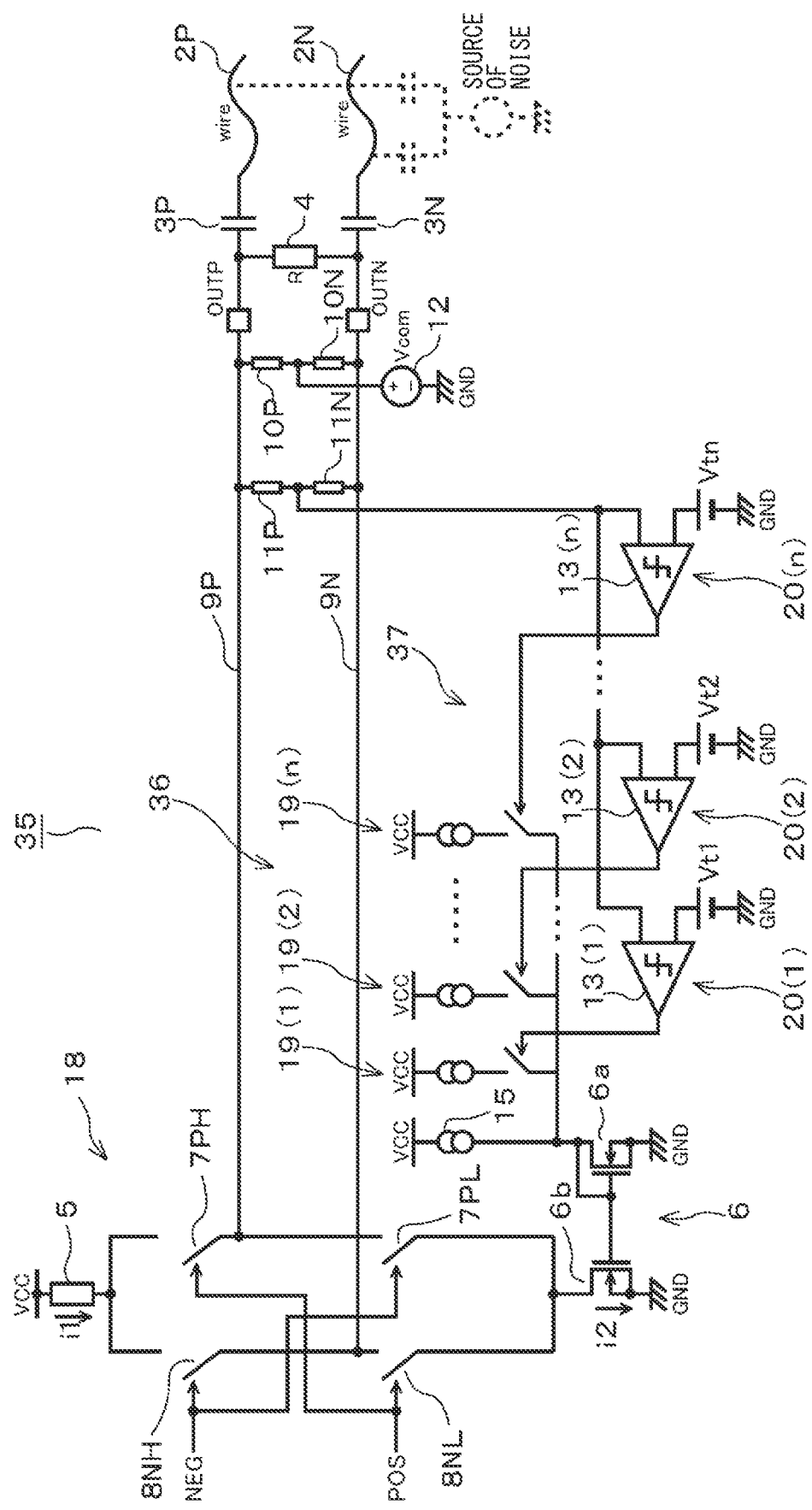
FIG. 9 is a circuit diagram showing a configuration of the differential communication driver circuit according to a seventh embodiment.
Figure 10:
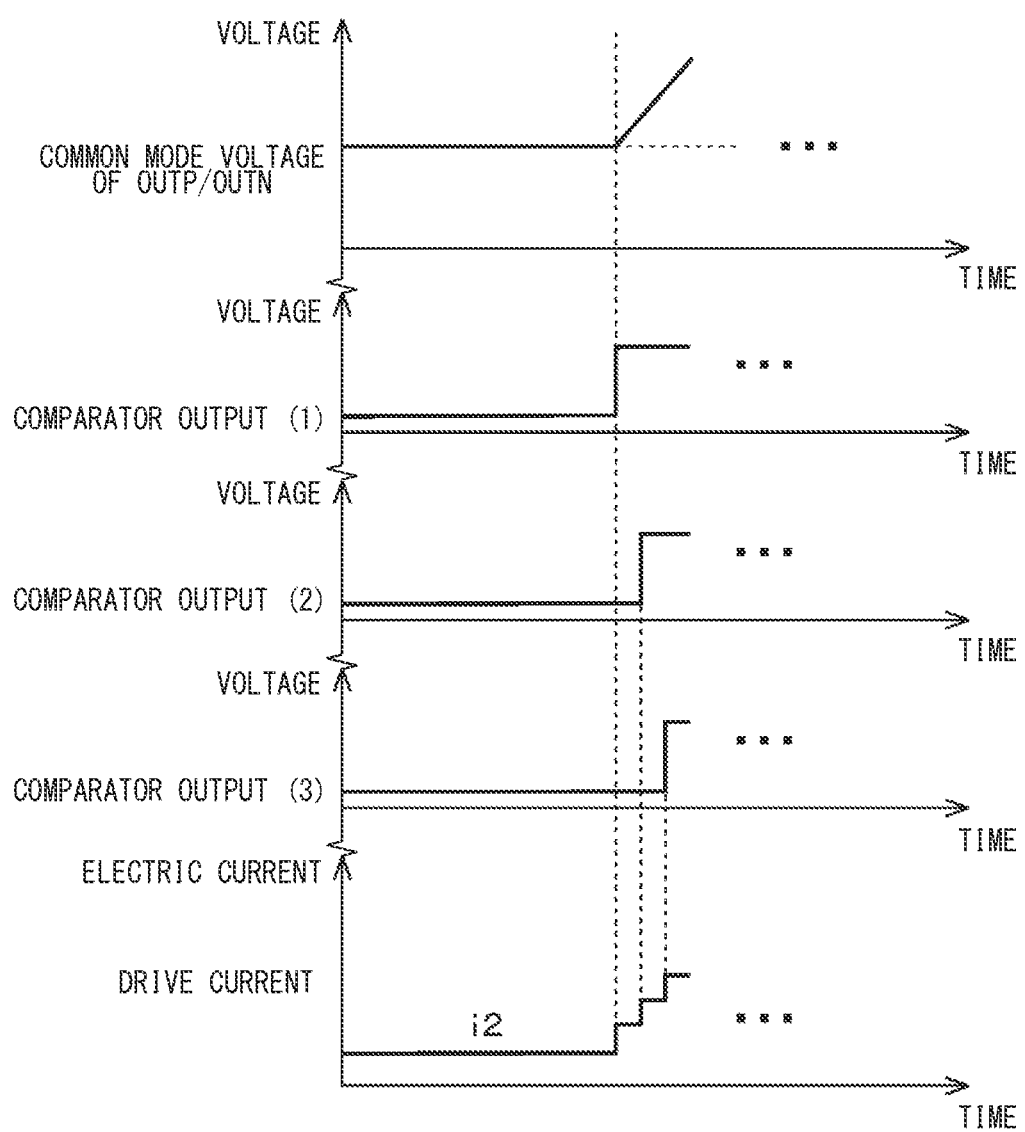
FIG. 10 is a timing chart showing a state in which a sink current i2 gradually/stepwise increases as an in-phase noise voltage increases.

Seventh Embodiment, FIG. 9, and FIG. 10

A differential communication driver circuit 35 of the seventh embodiment shown in FIG. 9 has a configuration, in which a plurality of sets of the drive assisting unit 19 and the noise detection unit 20 in the driver circuit 1 of the first embodiment are connected in parallel, for example by n sets. Here, the single drive assisting unit and noise detection unit are referred to as a sub drive assisting unit 19 and a sub noise detection unit 20. N sets of sub drive assisting units 19 constitute a drive assisting unit 36. Then, threshold voltages Vt1, Vt2, . . . , Vtn respectively set in the comparator 13 of the noise detection units 20(1), 20(2), . . . , 20(n) are configured to increase stepwise. The above provides a noise detection unit 37.

Next, the operation of the seventh embodiment will be described. When the voltage of in-phase noise detected by each of those comparators 13 rises and sequentially exceeds the respective threshold voltages Vt1, Vt2, . . . , Vtn, the output signal of each of the comparators 13 changes from a low level to a high level, in order, as shown in FIG. 10. In such manner, the switches 17 of the sub drive assisting units 19(1), 19(2), . . . , 19(n) are turned on in sequence. In such manner, the sink current i2 as the drive current can be increased stepwise.

Figure 11:
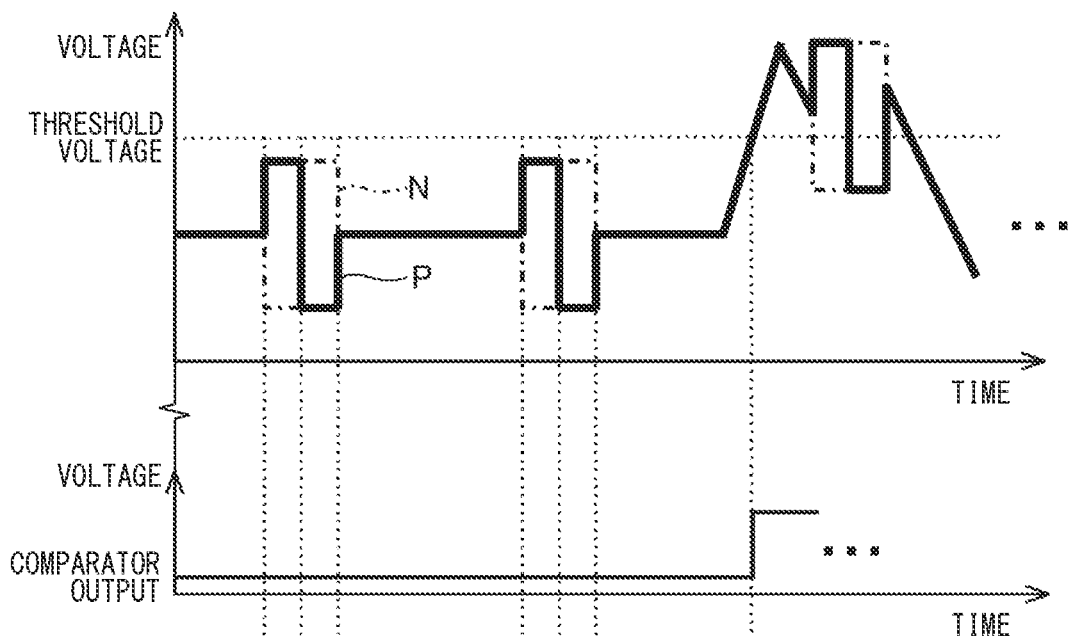
FIG. 11 is a diagram showing a change in an output signal of a comparator with a change in a threshold voltage (No. 1)
Figure 12:
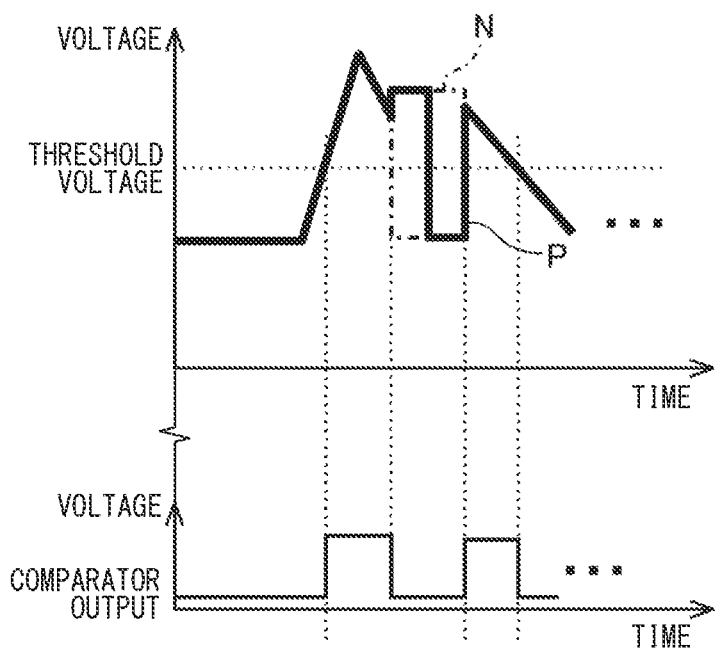
FIG. 12 is a diagram showing a change in an output signal of the comparator with a change in the threshold voltage (No. 2)
Figure 13:
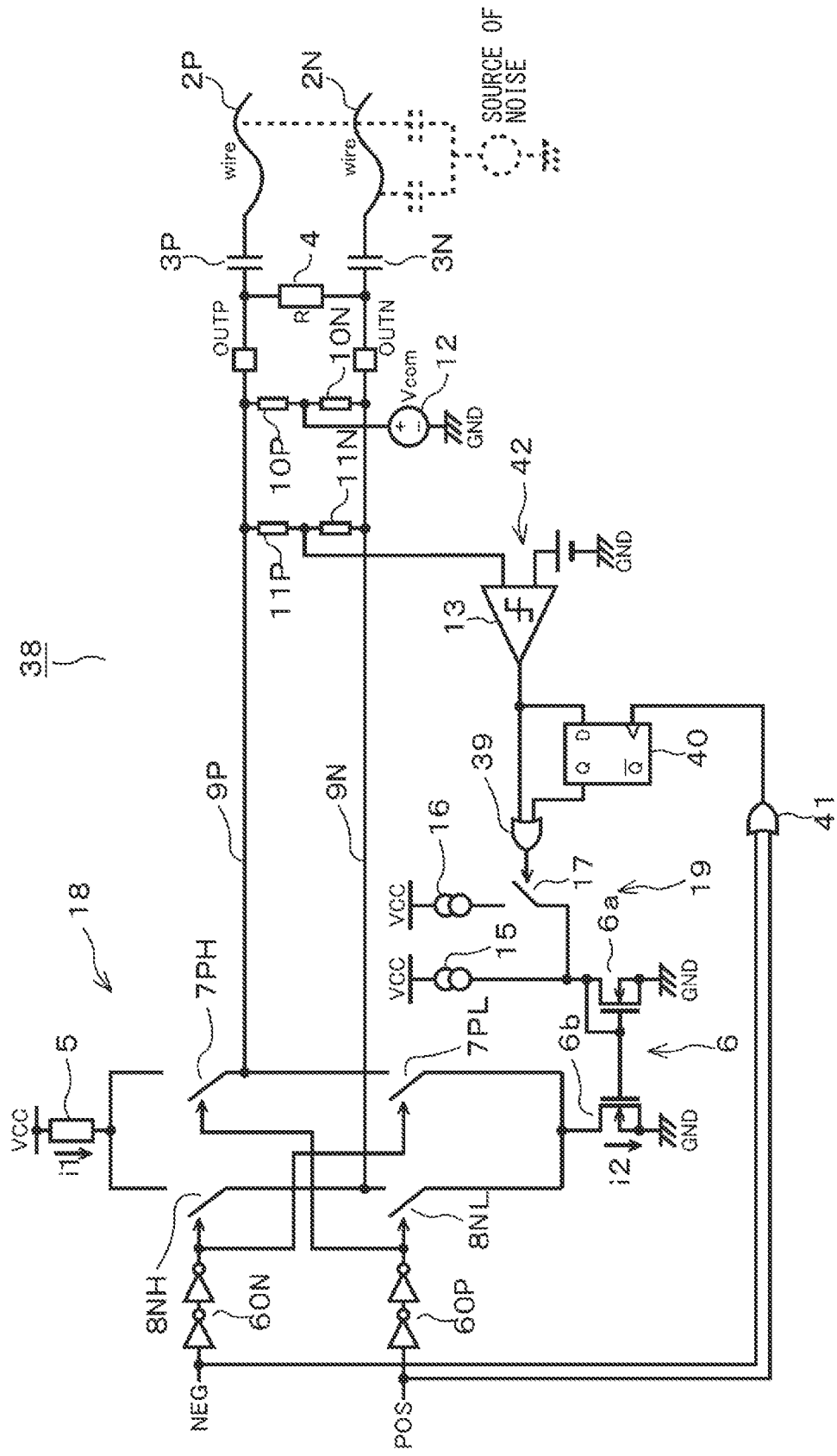
FIG. 13 is a circuit diagram showing a configuration of the differential communication driver circuit according to an eighth embodiment.

Eighth Embodiment, FIG. 11 and FIG. 12 and FIG. 13

Unlike the first embodiment, the threshold voltage of the comparator 13 in the eighth embodiment is set to be higher than the level of the differential signal output by the driver circuit 1 as shown in FIG. 11, and, in response to the in-phase noise exceeding such level, the switch 17 is turned on. However, as shown in FIG. 12, the terminal voltage of the resistor element 4 may change due to the driver circuit 1 outputting a differential signal during a period when the in-phase noise is applied and the comparator 13 turns on the switch 17, possibly dropping the input voltage of the comparator 13 below the threshold voltage, the output signal of the comparator 13 may change to a low level and the drive assisting unit 19 may become non-functional.

Therefore, in a differential communication driver circuit 38 of the eighth embodiment shown in FIG. 13, an OR gate 39 and a latch circuit 40 which is a D flip-flop are inserted to a position between the comparator 13 and the switch 17. One of the input terminals of the OR gate 39 and an input terminal D of the latch circuit 40 are connected to the output terminal of the comparator 13. The other of the input terminals of the OR gate 39 is connected to an output terminal Q of the latch circuit 40. A clock terminal of the latch circuit 40 is connected to an output terminal of the OR gate 41, and the control signals POS and NEG are respectively input to input terminals of the OR gate 41. The above provides a noise detection unit 42.

Further, the control signal POS is given to the switches 7PH and 8PL via, for example, a timing adjustment circuit 60P composed of a series circuit of two NOT gates. Similarly, the control signal NEG is given to the switches 8NH and 7PL via a timing adjustment circuit 60N.

Figure 14:
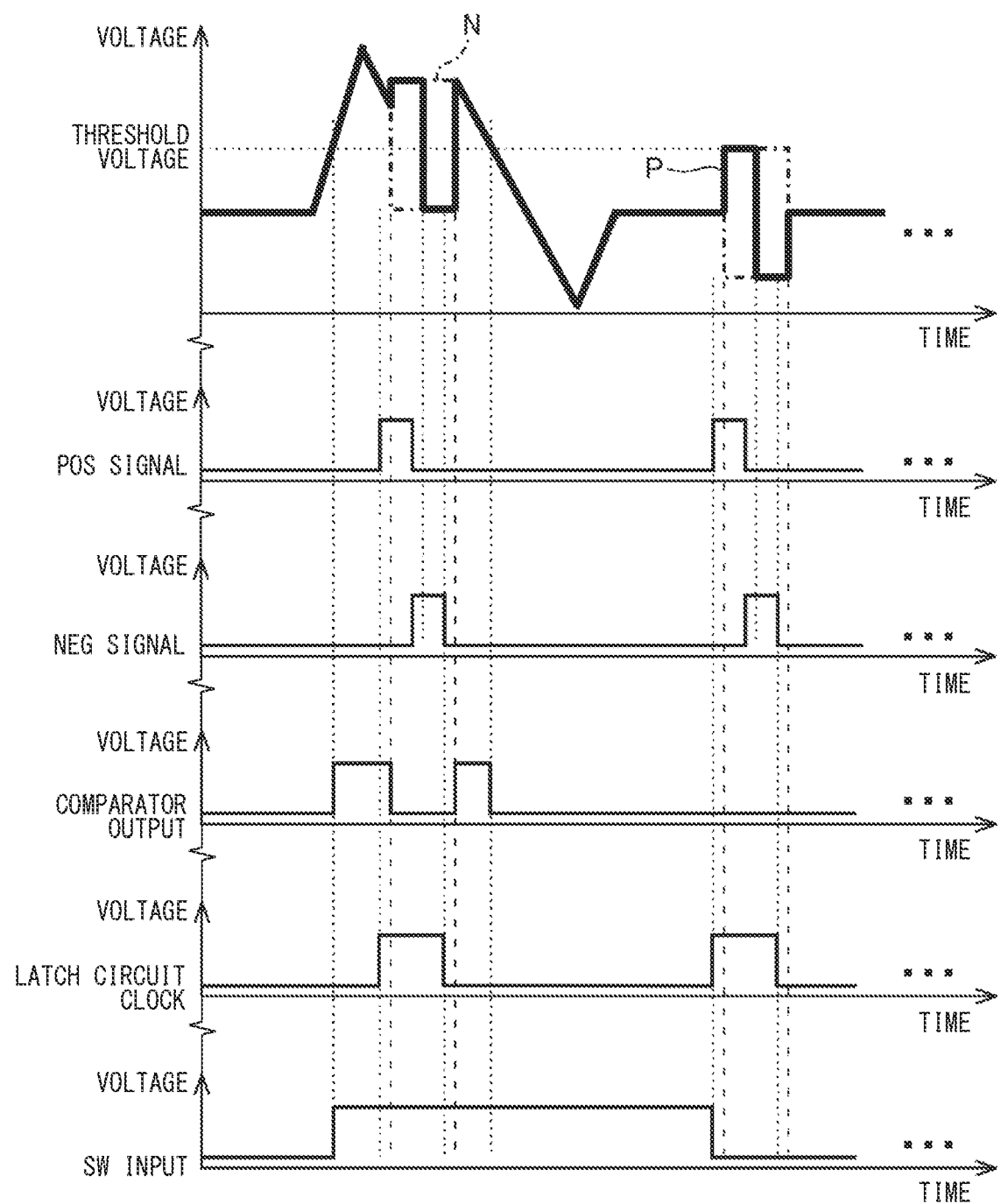
FIG. 14 is a timing chart showing the operation of the noise detection unit and the drive assisting unit.

Next, the operation of the eighth embodiment will be described. As shown in FIG. 14, when the driver circuit 38 outputs a differential signal during a period in which the in-phase noise is applied, even if a certain period in which the output signal of the comparator 13 is inverted to a low level occurs, a step before such inversion serves as a latch by the latch circuit 40 latching a high level signal of the comparator 13 at an edge of the control signal POS. Since the switch 17 is given a logical sum signal of the output signal of the comparator 13 and the output signal Q of the latch circuit 40, the signal is maintained at a high level without being inverted, and the switch 17 continues to be in an ON state. That is, the period during which the output signal of the comparator 13 is inverted to the low level is complemented by the signal latched by the latch circuit 40.

Then, at a timing when a differential signal is output after the in-phase noise disappears, the output signal of the comparator 13 maintains the low level, thereby the latch circuit 40 latches the low level signal of the comparator 13 at the edge of the control signal POS. In such manner, the switch 17 is turned off.

Figure 15:
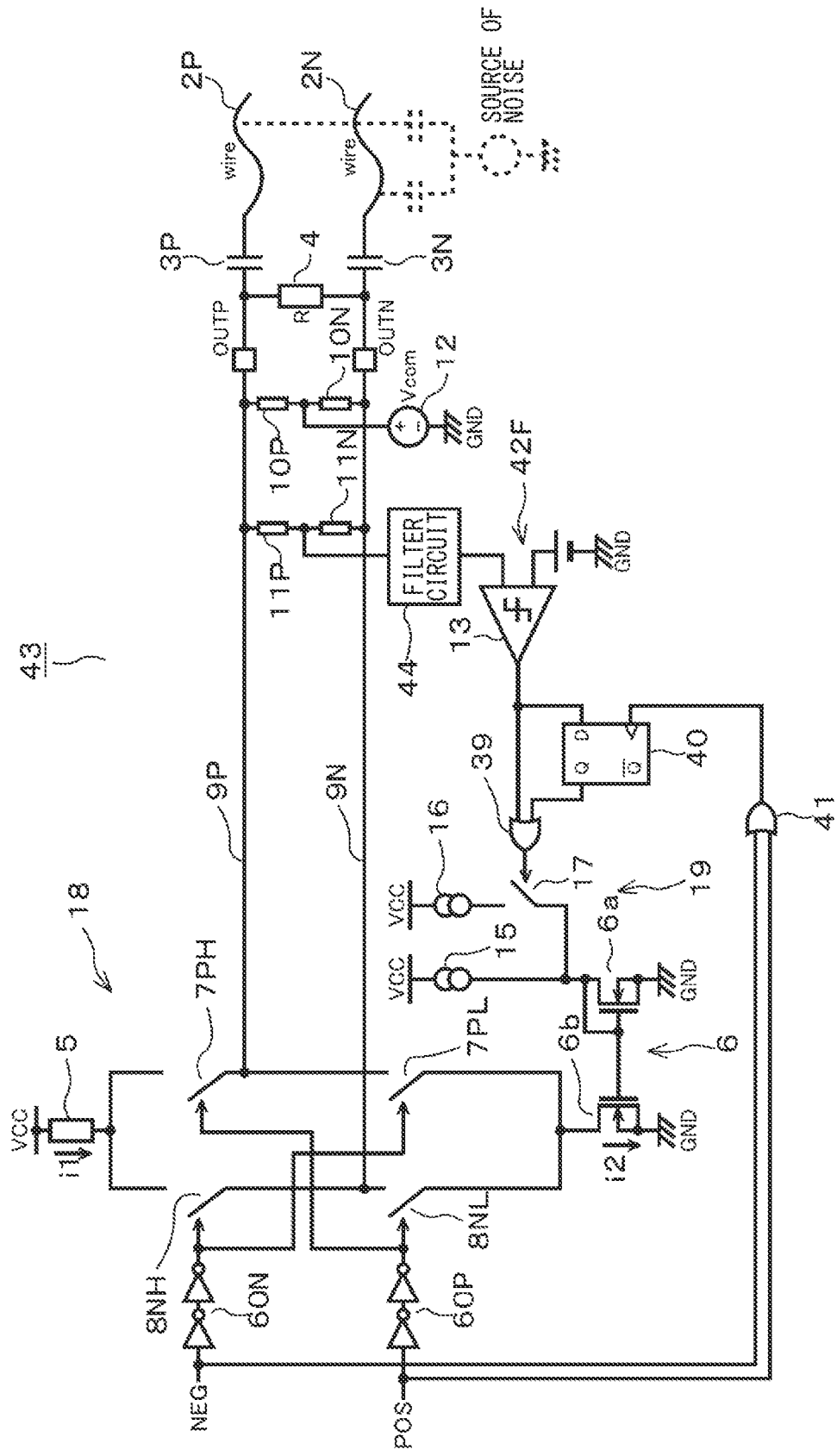
FIG. 15 is a circuit diagram showing a configuration of the differential communication driver circuit according to a ninth embodiment.

Ninth Embodiment, FIG. 15

Figure 16:
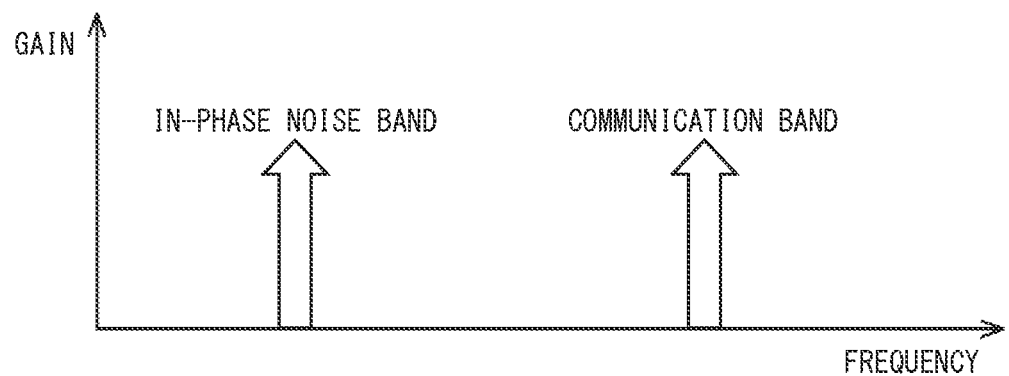
FIG. 16 is a diagram showing frequency bands of in-phase noise and communication signal.
Figure 17:
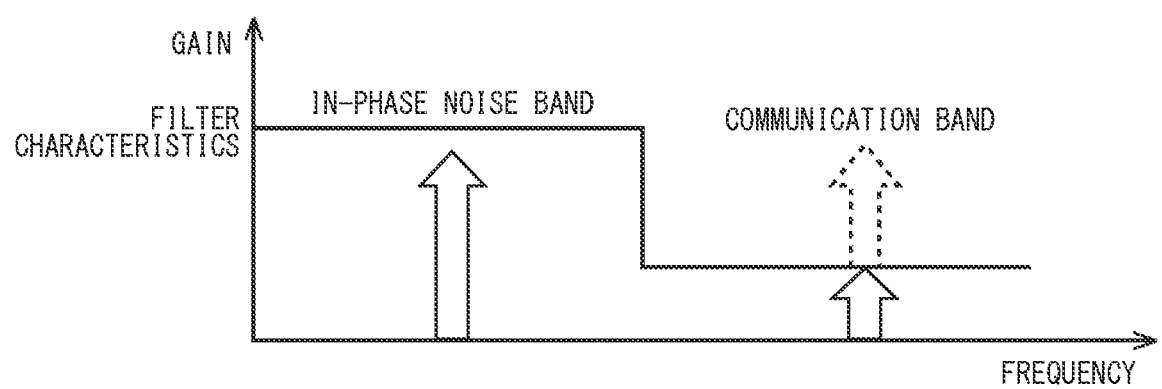
FIG. 17 is a diagram showing frequency characteristics of a filter circuit.

In a differential communication driver circuit 43 of the ninth embodiment shown in FIG. 15, the driver circuit 38 of the eighth embodiment includes a filter circuit 44 being arranged at the non-inverting input terminal of the comparator 13, for providing a noise detection unit 42F. As shown in FIG. 17, the filter circuit 44, for example, has characteristics, which suppress a signal component of a frequency band of the communication signal when the frequency band of the in-phase noise and the frequency band of the differential communication signal are different, as shown in FIG. 16. In such manner, the possibility that the comparator 13 malfunctions due to the influence of the differential communication signal can be reduced. Further, the filter circuit may be used as an attenuation circuit that attenuates the signal in a DC manner without depending on/regard to the frequency band.

Tenth Embodiment

Figure 18:
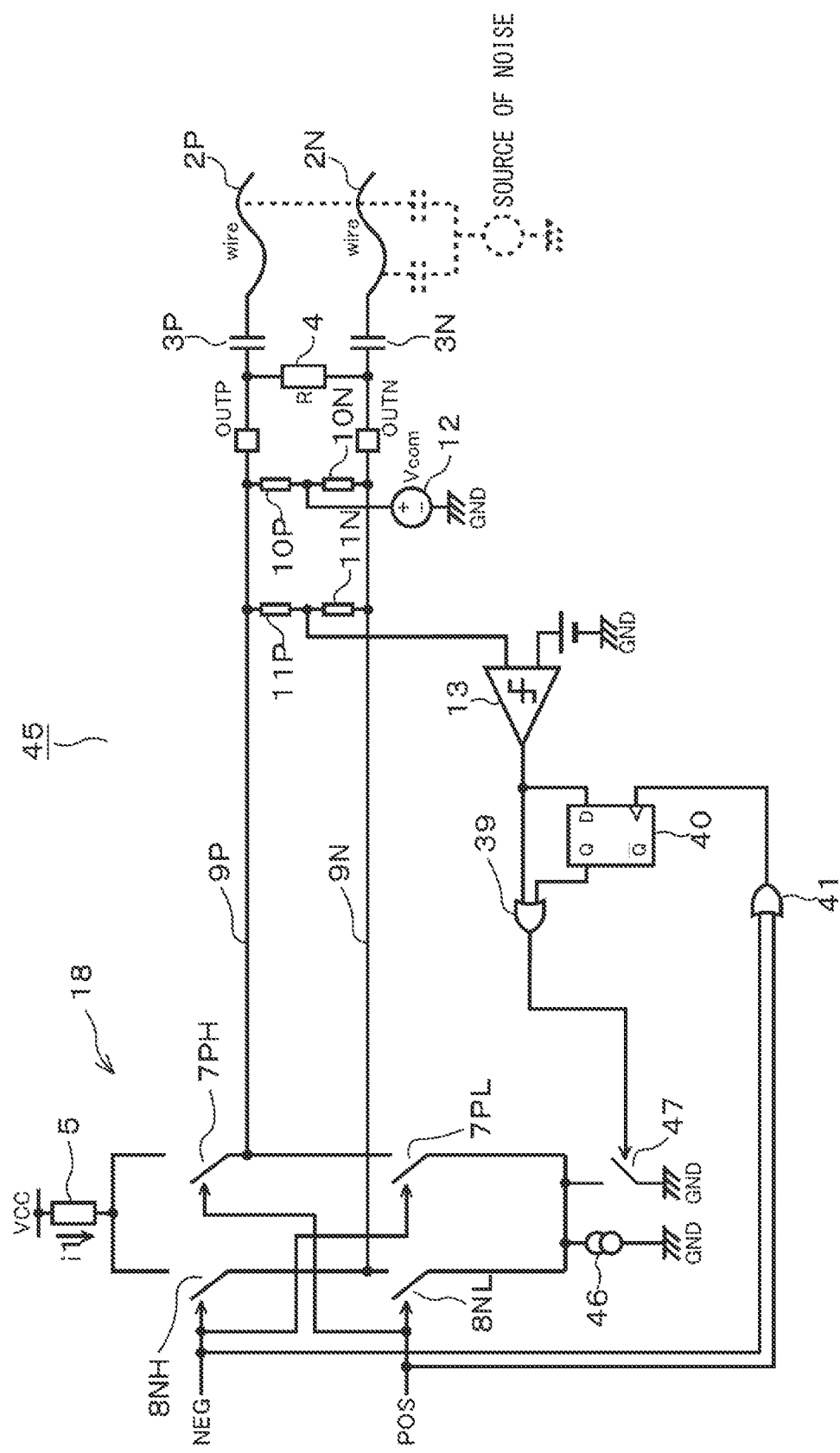
FIG. 18 is a circuit diagram showing a configuration of the differential communication driver circuit according to a tenth embodiment.

In a differential communication driver circuit 45 of the tenth embodiment shown in FIG. 18, the current mirror circuit 6 and the drive assisting unit 19 are deleted from the driver times 38 of the eighth embodiment, and an electric current source 46 replacing the current mirror circuit 6 and a normally open type switch 47 are arranged as a parallel circuit. Then, the output signal of the OR gate 39 controls the switch 47 to close. Even in such configuration, the sink current can be increased by closing the switch 47. The switch 47 corresponds to a drive assisting unit.

Eleventh and Twelfth Embodiments

Figure 19:
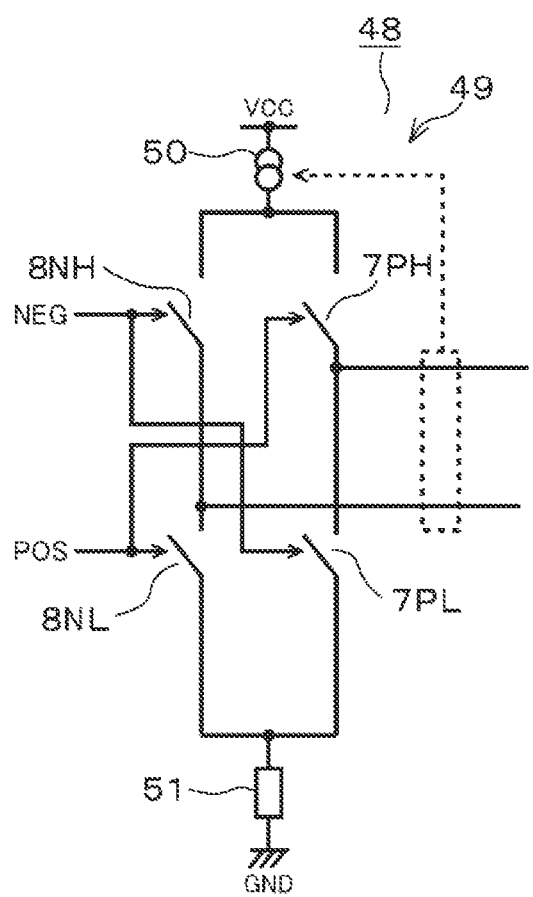
FIG. 19 is a circuit diagram showing a configuration of a drive circuit unit according to an eleventh embodiment.
Figure 20:
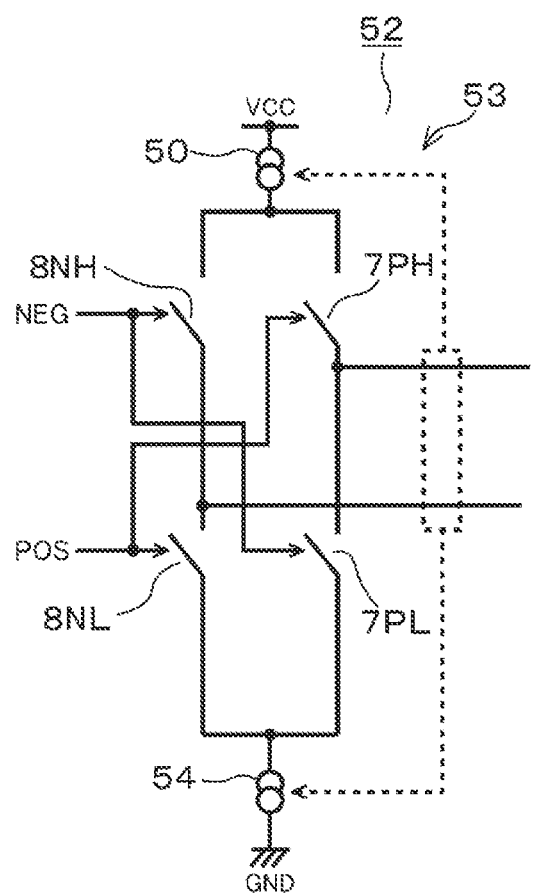
FIG. 20 is a circuit diagram showing a configuration of the drive circuit unit according to a twelfth embodiment.

In the above embodiments, the low-side drive capability, that is, the sink current is increased. On the other hand, in a differential communication driver circuit 48 of the eleventh embodiment shown in FIG. 19, a configuration, in which a variable current source 50 is arranged in the power source VCC of a drive unit 49 and a resistor element 51 is arranged on a ground side, may be adoptable for increasing high-side drive capability, i.e., for increasing the source current, for example. Further, in a differential communication driver circuit 52 of the twelfth embodiment shown in FIG. 20, both of the high-side and low-side drive capabilities may be increased by arranging a variable current source 54 on a ground side in a drive unit 53.

Although the present disclosure has been described in accordance with the embodiments, it is understood that the present disclosure is not limited to such embodiments or structures. The present disclosure incorporates various modifications and variations within the scope of equivalents. In addition, various combinations and forms, and further, other combinations and forms including only one element added thereto or subtracted therefrom, together with addition/subtraction of more than/less than one element are also within the sprit and the scope of the present disclosure.

What is claimed is:

1. A differential communication driver circuit comprising:
    a drive unit connected to differential signal lines via coupling capacitors and driving the differential signal lines by a source current and a sink current;
    a noise detection unit detecting that in-phase noise is applied to the differential signal lines; and
    a drive assisting unit increasing, when the in-phase noise is detected, the sink current such that noise effects on the differential signal lines are reduced, wherein
    the noise detection unit includes:
        a comparator that compares a midpoint voltage of output signal lines with a threshold voltage,
        a latch circuit that latches an output signal of the comparator according to transmission control signals that control the drive unit, and
        a logic circuit that outputs, to the drive assisting unit, a logic output signal based logically upon: (i) an output signal of the comparator and (ii) an output signal of the latch circuit.

2. The differential communication driver circuit of claim 1, wherein
    the noise detection unit includes a filter circuit on an input side for passing only a band including the in-phase noise.

3. The differential communication driver circuit of claim 1, further comprising:
    an offset voltage source;
    an upper voltage source resistor and a lower voltage source resistor configured in series between the output signal lines, wherein the offset voltage source is connected to a midpoint between the voltage source resistors;
    a current mirror circuit including a left transistor and a right transistor, wherein a left transistor gate, a right transistor gate, and a right transistor drain are joined to form a current mirror input node;
    a base current source configured to provide a base current to the current mirror input node;
    an assisting current source configured to provide an assisting current to the current mirror input node through an assisting switch, wherein
    the noise detection unit is configured to turn ON the assisting switch upon detecting that the in-phase noise is applied to the differential signal lines.

4. The differential communication driver circuit of claim 3, wherein the noise detection unit further includes:
    an upper noise detection resistor;
    a lower noise detection resistor, configured in series with the upper noise detection resistor to form a detection resistor series between the output signal lines, and having the midpoint voltage at a midpoint of the detection resistor series; and
    a threshold voltage source, wherein
    the comparator includes:
        (i) a non-inverting terminal receiving the midpoint voltage,
        (ii) an inverting terminal receiving the threshold voltage, and
        (iii) an output terminal outputting the output signal of the comparator.

5. The differential communication driver circuit of claim 1, wherein
    the drive unit includes a current mirror circuit,
    the drive assisting unit includes a series circuit of (i) an assisting current source and (ii) a normally open type assisting switch, and
    the latch circuit and the logic circuit are located between the comparator and the normally open type assisting switch.

* * * * *